United States Patent
Jain et al.

(10) Patent No.: US 6,904,578 B2
(45) Date of Patent: Jun. 7, 2005

(54) SYSTEM AND METHOD FOR VERIFYING A PLURALITY OF STATES ASSOCIATED WITH A TARGET CIRCUIT

(75) Inventors: Jawahar Jain, Santa Clara, CA (US); Amit Narayan, Redwood City, CA (US); Subramanian K. Iyer, Austin, TX (US); Debashis Sahoo, Stanford, CA (US)

(73) Assignee: Fujitsu Limited, Kawasaki (JP)

( * ) Notice: Subject to any disclaimer, the term of this patent is extended or adjusted under 35 U.S.C. 154(b) by 260 days.

(21) Appl. No.: 10/391,282

(22) Filed: Mar. 17, 2003

(65) Prior Publication Data

US 2004/0093570 A1 May 13, 2004

Related U.S. Application Data

(60) Provisional application No. 60/426,207, filed on Nov. 13, 2002.

(51) Int. Cl.[7] ............................ G06F 17/50; G06F 9/45
(52) U.S. Cl. ........................ 716/5; 716/4; 716/7; 703/2
(58) Field of Search .......................... 716/1–5, 7; 703/2

(56) References Cited

U.S. PATENT DOCUMENTS

| | | | |
|---|---|---|---|
| 6,086,626 A | | 7/2000 | Jain et al. |
| 6,292,916 B1 | | 9/2001 | Abramovici et al. |
| 6,308,299 B1 | | 10/2001 | Burch et al. |
| 6,321,186 B1 | | 11/2001 | Yuan et al. |
| 6,389,374 B1 | * | 5/2002 | Jain et al. ...................... 703/2 |
| 6,473,884 B1 | | 10/2002 | Ganai et al. |
| 6,499,129 B1 | | 12/2002 | Srinivasan et al. |
| 6,651,234 B2 | * | 11/2003 | Gupta et al. ...................... 716/7 |
| 6,728,665 B1 | * | 4/2004 | Gupta et al. ...................... 703/2 |
| 2004/0199887 A1 | * | 10/2004 | Jain et al. ...................... 716/5 |

OTHER PUBLICATIONS

Cabodi et al., "Can BDDs compete with SAT solvers on Bounded Model Checking?," Jun. 2002, Proceedings 39th Design Automation Conference, pp. 117–122.*

Copty et al., "Benefits of Bounded Model Checking at an Industrial Setting," 2001, Lecture Notes in Computer Science, vol. 2102, pp. 436–453.*

Narayan et al., Partitioned ROBDDs—A Compact, Canonical and Efficiently Manipulable Representation for Boolean Functions, 1996, IEEE/ACM Int'l Conference on CAD, pp. 547–554.*

Narayan et al., "Reachability Analysis Using Partitioned–ROBDDs," 1997, IEEE/ACM In'l Conference on CAD, pp. 388–393.*

* cited by examiner

Primary Examiner—Leigh M. Garbowski
(74) Attorney, Agent, or Firm—Baker Botts L.L.P.

(57) ABSTRACT

A method for verifying a property associated with a target circuit is provided that includes receiving information associated with a target circuit, the information identifying a property within the target circuit to be verified. One or more partitioned ordered binary decision diagram (POBDD) operations are then executed using the information in order to generate a first set of states at a first depth associated with a sub-space within the target circuit. Bounded model checking may be executed using the first set of states in order to generate a second set of states at a second depth associated with the sub-space within the target circuit. The first set of states may be used as a basis for the second set of states such that the second depth is greater than the first depth.

30 Claims, 3 Drawing Sheets

SYSTEM AND METHOD FOR VERIFYING A PLURALITY OF STATES ASSOCIATED WITH A TARGET CIRCUIT

RELATED APPLICATIONS

This application claims priority under 35 U.S.C. §119 of provisional patent application Ser. No. 60/426,207 entitled: "Verifying a Circuit Using One or More Partitioned Ordered Binary Decision Diagrams (POBDDs)" filed Nov. 13, 2002.

TECHNICAL FIELD OF THE INVENTION

This invention relates in general to the field of integrated circuit verification and more particularly to a system and method for verifying a plurality of states associated with a target circuit.

BACKGROUND OF THE INVENTION

Integrated circuits have become increasingly prevalent in today's society. The number of digital systems that include integrated circuits continues to steadily increase and may be driven by a wide array of products and systems. Added functionalities may be provided to integrated circuits in order to execute additional tasks or to effectuate more sophisticated operations in their respective applications or environments. Additionally, system parameters of integrated circuits may dictate that their operations be performed in an optimal time interval, which allows for even more operations to be accommodated in a given clock cycle. These rigorous demands associated with production and design generally result in the need for more advanced and complex verification processes and procedures.

Verification techniques are generally implemented in order to ensure that an integrated circuit or a digital element is capable of performing its intended functionality. In other cases, verification techniques may be used in order to ascertain whether a selected characteristic, behavior, or property is present in a given target circuit. Flaws or inaccuracies in an integrated circuit or a digital element may inhibit system functionality and/or cause significant operational problems in a corresponding architecture.

In integrated circuit and other digital applications, manual inspection is simply not feasible as there is a prolific amount of information that must be checked or validated. In addition to being cumbersome, manual inspection is incapable of meeting optimal accuracy parameters. In other scenarios, the task of verification or design validation may be executed using a simulation. Using a simulation based approach, a designer may analyze test vectors in order to verify or validate the correctness of the design. However, such a process is highly time intensive and impractical because it is not feasible to exhaustively simulate a design to ensure correctness for every possible outcome. Accordingly, the ability to verify or validate a design for any integrated circuit or digital element presents a significant challenge to digital system designers and integrated circuit manufacturers.

SUMMARY OF THE INVENTION

From the foregoing, it may be appreciated by those skilled in the art that a need has arisen for an improved verification approach that offers the ability to properly verify a target circuit in order to ensure that it includes some property or that it is capable of performing its intended functionality. In accordance with one embodiment of the present invention, a system and method for verifying a target circuit are provided that substantially eliminate or greatly reduce disadvantages and problems associated with conventional verification, simulation, or validation techniques.

According to one embodiment of the present invention, there is provided a method for verifying a target circuit that includes receiving information associated with a target circuit, the information identifying a property to be verified. One or more partitioned ordered binary decision diagram (POBDD) operations are then executed using the information in order to generate a first set of states at a first depth associated with a sub-space within the target circuit. Bounded model checking may be executed using the first set of states in order to generate a second set of states at a second depth associated with the sub-space within the target circuit. The first set of states may be used as a basis for the second set of states such that the second depth is greater than the first depth.

Certain embodiments of the present invention may provide a number of technical advantages. For example, according to one embodiment of the present invention, a verification approach is provided that is significantly faster than other verification or simulation approaches. This may be a result of the integration of several verification approaches that may be combined in order to enhance a starting point associated with bounded model checking (BMC) operations. This allows the verification approach to be implemented for elements that have a large sequential depth and, thus, be applicable to communication circuits, circuits containing counters, or finite state machines for example. Finite state machines may generally have depths much larger than what can be accommodated using BMC operations exclusively.

Another technical advantage associated with one embodiment of the present invention relates to extending reachability parameters associated with a target circuit. By implementing the verification approach provided, new or unexplored deep states, which would otherwise not be visited, may be uncovered. Such deep states may be generally neglected in using satisfiability (SAT) procedures and processes, or binary decision diagram (BDD) operations in order to execute verification of a target circuit. Accordingly, the system offered in accordance with the teachings of the present invention can accommodate a wide array of sophisticated circuits, which allows verification to be executed deep into circuits where SAT and BDD methods are restricted. Certain embodiments of the present invention may enjoy some, all, or none of these advantages. Other technical advantages may be readily apparent to one skilled in the art from the following figures, description, and claims.

BRIEF DESCRIPTION OF THE DRAWINGS

To provide a more complete understanding of the present invention and features and advantages thereof, reference is made to the following description, taken in conjunction with the accompanying figures, wherein like reference numerals represent like parts, in which.

DETAILED DESCRIPTION OF EXAMPLE EMBODIMENTS

Figure 1:
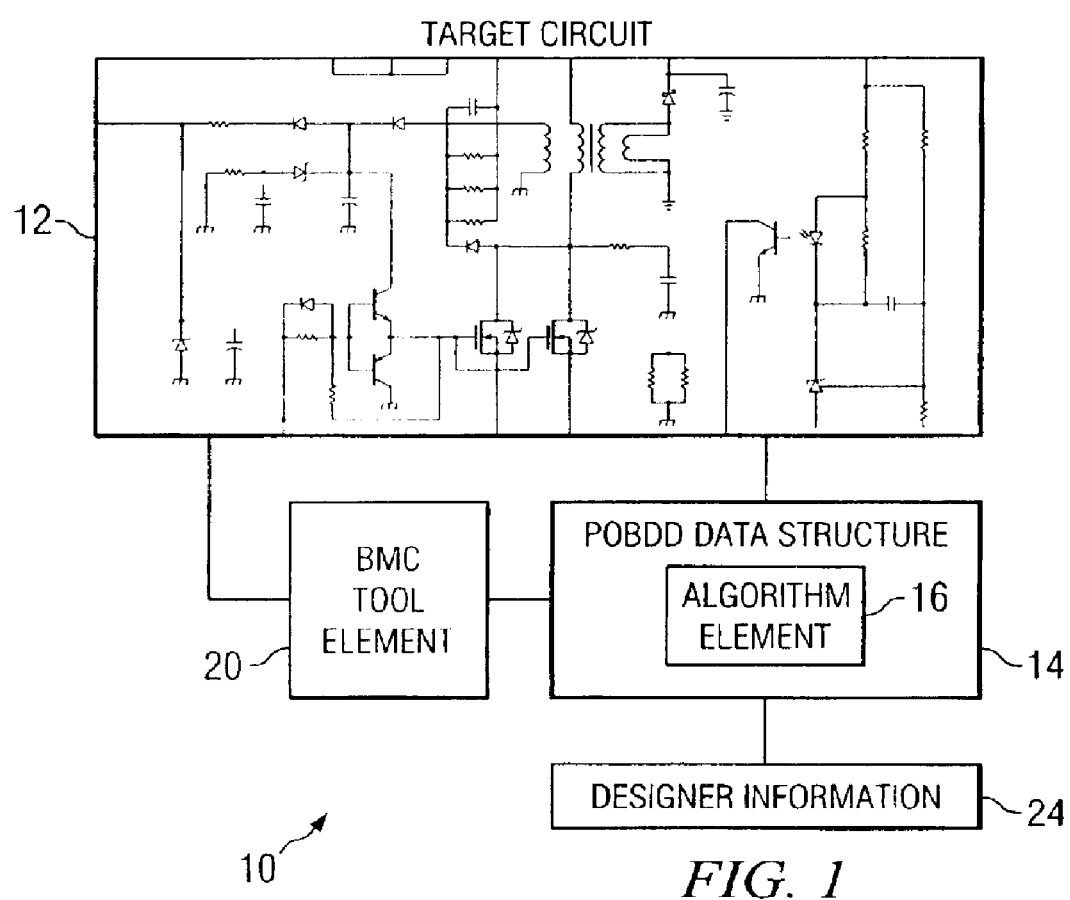
FIG. 1 is a simplified block diagram of a system for verifying a plurality of states in accordance with one embodiment of the present invention.

FIG. 1 is a simplified block diagram of a system 10 for verifying a plurality of states associated with a target circuit 12. System 10 may include a partitioned ordered binary decision diagram (POBDD) data structure 14 that includes an algorithm element 16. Additionally, system 10 may include a bounded model checking (BMC) tool element 20 and a segment of designer information 24 that may be communicated to POBDD data structure 14. System 10 may generally be positioned within, or otherwise operate in conjunction with, any integrated circuit, digital element, processing configurations, or binary architecture in which verification procedures or processes may be implemented. Additionally, system 10 may be provided in cooperation with any device, component, hardware, software, object, or element associated with digital processing of information or data.

According to the teachings of the present invention, system 10 operates to provide a verification process capable of reaching significant depths in sub-spaces of target circuit 12. By using POBDD data structure 14 and an analysis that involves imaging and preimaging operations, selected states that are provenly deep may be identified. These states may then be represented in a BDD format and then mapped as a conjunctive normal form (CNF) formula. The CNF formula may then be provided to BMC tool element 20 as a set of starting states from which to begin an enhanced verification analysis. BMC tool element 20 may then execute bounded model checking operations using these starting states (instead of initiating its operations from a single state) in order to effectuate a verification procedure associated with target circuit 12. A single state generally represents an initial state that is predominantly shallow. By providing starting states that are already deep, BMC tool element 20 achieves enhanced verification results because it may reach deeper into target circuit 12. In addition, the initial deep states may be obtained using POBDD data structure 14 in an optimal time interval, which in turn results in a significant advance in efficacy for the verification procedure.

System 10 provides a verification architecture that is significantly faster than other verification or simulation techniques. This may be due, in part, to the integration of several verification approaches that may be combined in order to enhance a starting point associated with bounded model checking operations. In certain embodiments, such a verification approach may be particularly beneficial for elements that have a large sequential depth.

System 10 may also extend reachability parameters associated with target circuit 12. New or unexplored deep states within target circuit 12, that would otherwise not be visited, may be uncovered using system 10. Deep states are generally neglected in using satisfiability (SAT) procedures, or binary decision diagram (BDD) operations to execute verification of a given target circuit. System 10 can accommodate a more complete analysis, which allows verification to be executed deep into circuits where SAT and BDD methods are restricted. In a general sense, the architecture of system 10 operates to bridge the gap between simulation and verification approaches and methods that are inadequate or inappropriate for more complex or sophisticated analyses. Simultaneously, system 10 may achieve a significant reduction in latency associated with the verification process.

Depth may be an exact depth or the approximate depth depending on what the user wants. The approximate depth is only an upper bound on the actual depth. To calculate the depth of the states, the following operation may be implemented. Assume the user is starting from set of states $s\_0$ and assume given windows w, w' where w' is a complement of w). Referring to $s\_0$ as a BASE-set, the following operations may be executed:

1. image on BASE-set (under window w) and get $s\_1$;
2. pre-image on $s\_1$ in window w' and get pre-$s\_1(w')$;
3. image on pre-$s\_1(w')$ (under window w) and get $s\_1'$;
4. calculate $s\_1''=s\_1-s\_1'$ $s\_1''$ reflecting the set of states in window w that cannot be reached from outside the window. $s\_1''$ becomes now our starting point (BASE-set) to calculate states of even greater depth.

In general, steps 1–4 can be suitably repeated, giving states with greater and greater depth. This takes into consideration states that are of a given depth as calculated from within the window w. It can be suitably modified, where appropriate, to include states whose depth is some minimum "d" where the path of length "d" criss-crosses from one window to another. This can be achieved by keeping a set whose depth is updated during each step of image/pre-image. There can be numerous ways of keeping a running count of depth of some states. A simple way to do this calculation can be seen if the reachability is done in a breadth-first manner. To each partition $w\_1, \ldots, w\_k$ the above procedure may be applied and then a calculation may be executed reflecting the actual depth of a state even if it is obtained by a criss-cross path starting form initial state.

Target circuit 12 is an electronic or digital object sought to be tested in order to verify that it operates according to its prescribed or intended functionality. The integrity, validity, or design specifications of a sub-space within target circuit 12 may be analyzed using POBDD data structure 14. Target circuit 12 may include any associated circuitry, inclusive of logic gates, counters, inverters, buffers, or any other suitable devices, components, or objects capable of cooperating or interacting with target circuit 12. Target circuit 12 may alternatively be any other suitable device, component, architecture, arrangement, hardware, software, object or element capable of processing binary data or digital information in a verification environment. Target circuit 12 may be designed specifically to include (or be capable of performing) some property. The term 'property' as used herein in this document is inclusive of any capability, characteristic, operation, action, or behavior that may be associated with target circuit 12. In operation, target circuit 12 may be verified or otherwise validated in order to ensure that it maintains its designated property or characteristic, or that it performs a prescribed operation properly.

POBDD data structure 14 is an element operable to execute partitioning of BDD elements in a binary or digital environment. POBDD data structure 14 is a representation of a Boolean function for manipulation. As referred to herein, POBDD data structure 14 may be inclusive of a partitioned reduced order binary decision diagram (PROBDD) or BDD data structures (potentially with partitioning) where appropriate. The terms PROBDD and POBDD are interchangeable and generally represented in various suitable fashions (for purposes of brevity in certain cases) in describing their applications. POBDD data structure 14 may receive designer information 24 and perform a preliminarily analysis on target circuit 12 in order to retrieve a first set of states based on designer information 24. The first set of states from a sampled sub-space may then be used in order to augment or otherwise enhance the capabilities of BMC tool element 20. POBDD data structure 14 may invoke one or more algorithms included in algorithm element 16 in order to evaluate a selected property associated with target circuit 12. The first set of states allows BMC tool element 20 to extend deep into target circuit 12.

POBDDs are generally canonical and, therefore, may be used for combinational equivalence checking. POBDDs may be successively applied in reachable analyses for sequential circuit verification. Reachable state sets may be represented as POBDDs. This minimizes the memory requirement by only keeping one partition in a corresponding memory during a given time interval. Additionally, fixed point computations may be performed on each partition separately using reachability algorithms, which may be included within algorithm element 16, in conjunction with POBDD protocols that are effectuated by POBDD data structure 14.

POBDD data structure 14 is generally faster than other approaches used in verification operations. Moreover, the partitioned structure of POBDD data structure 14 is compact and may provide for much easier parallelization. Additionally, POBDD data structure 14 may offer dynamic partitioning that avoids memory deterioration, which may also be referred to in certain applications as 'memory blowup.' POBDD data structure 14 may cover a large volume of states within target circuit 12 quickly and, further, break designs into loosely coupled sets of interacting finite state machines.

In operation of an example embodiment, a designer or a manufacturer may write some program that identifies a property, characteristic, operation, or behavior that is sought to be tested or verified in target circuit 12. The property or characteristic may be suitably written in a particular syntax before it is communicated to POBDD data structure 14. The program may then be properly communicated to POBDD data structure 14, whereby POBDD data structure 14 tests the specified property in target circuit 12. POBDD data structure 14 may then generate a first set of states, represent the first set in a BDD format, and map the BDD format into a CNF formula to be forwarded to BMC tool element 20.

CNF is a conjunction of clauses, where clauses are either attribute-value conditions or disjunctions of attribute-value conditions. A Boolean expression having junctors in {AND, OR} is in conjunctive normal form if no junctors are negated and if no AND junctor is dominated by an OR junctor. For example, (color=red or color=green) and (shape= rectangular) is a formula in CNF. A Boolean formula in this form is expressed as an AND of clauses, each of which is the OR of one or more literals. The theory of CNFs may also be thought of as a conjunction of disjunctions. Each disjunction can be represented as a clause that includes positive literals and negative literals. The variables may be quantified universally. For logic programming (Prolog, Fril, etc.) it is beneficial to be able to transform sentences into statements a computer can accommodate. Logic programming statements may take the form of horn clauses that are conditional sentences with a particularly simple structure. It can be shown that every propositional logic sentence is equivalent to a sentence in conjunctive normal form.

By invoking or implementing a selected algorithm within algorithm element 14, POBDD data structure 14 may selectively explore deep into target circuit 12 without looking at an entire circuit architecture or configuration. Viewing an entire circuit element may slow the verification process significantly. Instead, algorithm element 16 may be invoked such that predetermined locations within target circuit 12 are visited in order to evaluate a small fragment of states (within sub-spaces) in a deep manner.

Algorithm element 16 is a data processing object that may include one or more algorithms that allow for a specific or designated property to be explored or verified in target circuit 12. Algorithm element 16 may be included within POBDD data structure 14 or provided external thereto in accordance with particular processing needs or arrangements. Additionally, algorithm element 16 may communicate with any other external component that provides one or more instructions or characteristics to be used in verifying sub-spaces within target circuit 12. Moreover, algorithm element 16 may directly receive designer information 24 in order to verify one or more properties associated with target circuit 12. Designer information 24 may also include or specify the type of circuit or element being subjected to the verification process. Algorithm element 16 may include any suitable hardware, software, objects, or elements operable to facilitate the verification operations being executed by POBDD data structure 14.

For purposes of example and teaching it is useful to provide a further explanation of some of the algorithms that may be used in verifying selected properties associated with sub-spaces of target circuit 12. Many operations for the manipulation of Boolean functions can be performed efficiently for functions represented by OBDDs. For example, some of the basic operations are provided by:

1. Evaluation. For an OBDD G representing f and an input a compute the value f(a).
2. Reduction. For an OBDD G compute the equivalent reduced OBDD.
3. Equivalence test. Test whether two functions represented by OBDDs are equal.
4. Satisfiability problems. Problems may include:
   Satisfiability. For an OBDD G representing f find an input a for which f(a)=1 or output that no such input exists.
   SAT-Count. For an OBDD G representing f, compute the number of inputs a for which f(a)=1.
5. Synthesis (also referred to as apply). For functions f and g represented by an OBDD G include into G a representation for $f \text{\textcircled{x}} g$ where $\text{\textcircled{x}}$ is a binary Boolean operation (e.g., $\wedge$).
6. Replacements (also called Substitution).
   Replacement by constants. For a function f represented by an OBDD, for a variable $x_i$ and a constant $c \in \{0, 1\}$ compute an OBDD for $f_{|x_i=c}$.
   Replacement by functions. For functions f and g represented by an OBDD and for a variable $x_i$ compute an OBDD for $f_{|x_i=g}$.
7. Universal quantification and existential quantification. For a function f represented by an OBDD and for a variable $x_i$ compute an OBDD for $(\forall x_i:f):=f_{|x_i=0} \wedge f_{|x_i=1}$ or $(\exists x_i:f):= f_{|x_i=0} \vee f_{|x_i=1}$, respectively.

In OBDD packages the operation reduction is usually integrated into the other operations such that only reduced OBDDs are represented. Many applications of OBDDs concern functions given as circuits. Hence, one important operation is the computation of an OBDD for a function given by a circuit, which is usually performed by the symbolic simulation of the circuit. This means that OBDDs for the functions representing the input variables are constructed. This may be easy because an OBDD for the function $x_i$ merely consists of a node labeled by $x_i$ with the 0-sink as 0-successor and the 1-sink as 1-successor. The circuit may be evaluated in some topological order (each gate is considered after all its predecessors have been considered) and a computation is made for each gate. The computation is a representation of the function at its output by combining the OBDDs representing the functions at its input using the synthesis operation.

Another possibility is that a given circuit is built of larger blocks. In such a case, OBDDs may be computed for the functions computed by each block and combine the OBDDs with the operation replacement by functions. In the case of computed OBDDs, for the functions represented by two circuits, the equivalence operation for OBDDs may be applied in order to test the circuits for equivalence.

In applications such as Boolean matching, signatures for the considered functions may be computed. A signature is a property of a function that can be computed efficiently and that is likely to be different for different functions. Signatures can be used to detect that given functions are different. A very simple signature is the number of satisfying inputs of a function. The operation SAT-count may be applied in order to compute this and other signatures where appropriate.

BMC tool element 20 is a component operable to execute bounded model checking operations on target circuit 12. BMC tool element 20 may receive information from POBDD data structure 14 and use that information in order to execute verification techniques on target circuit 12. BMC tool element 20 may use semi-formal verification approaches and be further enhanced by using a first set of states provided by POBDD data structure 14. BMC tool element 20 may employ SAT techniques to execute proper bounded model checking. In bounded model checking, a Boolean formula is constructed that is satisfiable if the underlying state transition system can realize a finite sequence of state transitions that reaches certain states of interest. BMC tool element 20 may include any suitable device, component, hardware, software, object, or element operable to execute one or more bounded model checking processes or operations such that selected sub-spaces of target circuit 12 may be verified or validated.

BMC tool element 20 may also be appropriately modified such that it can utilize a first set of states instead of a single initial state. This may allow system 10 to reach provenly deep sub-spaces within target circuit 12. Accordingly, the capacity of the program within BMC tool element 20 is effectively enhanced in order to improve the verification process. After the BMC program is executed, it may be determined that neighboring segments have been exhaustively explored such that an adequate sampling of target circuit 12 has been effectuated. The decision of whether to continue sampling sub-spaces of target circuit 12 may rest with an end user or controlled by the BMC program characteristics.

For purposes of teaching and example, some of the principles and concepts associated with POBDD, PROBDD, and BDD operations are provided below. The proffered description is only being provided to assist in the understanding of some of the complex theorems associated with partitioned BDD technology. The description should not be construed to limit any of the operations of any of the elements of system 10. It is imperative to recognize that the following description is for purposes of example only and should not be interpreted to restrict any other suitable operations that may be executed by POBDD data structure 14 or any other element involved in partitioning operations or the verification process.

In order to describe partitioned ROBDDs, it is useful to consider the following example. Assume a Boolean function $f: B^n \to B$ defined over n inputs $X_n = \{X_1, \ldots, x_n\}$. The partitioned-ROBDD representation $X_f$ of f is defined as follows:

Given a Boolean function: $f: B^n \to B$ defined over $X_n$, a partitioned-ROBDD representation $X_f$ of f is a set of k function pairs, $\chi_f = \{(\omega_1, \bar{f}_1), \ldots, (\omega_k, \bar{f}_k)\}$ where, $\omega_i, B^n \to B$ and $\bar{f}_i: B^n \to B$, for $1 \leq i \leq k$, are also defined over $X_n$ and satisfy the following conditions:

1. $w_i$ and $\bar{f}_i$ are represented as ROBDDs with the variable ordering $\pi_i$, for $1 \leq i \leq k$.
2. $w_1 + w_2 + \ldots + w_k = 1$
3. $\bar{f}_i = w_i \wedge f$, for $1 \leq i \leq k$ In the example provided, + and $\wedge$ represent Boolean OR and AND respectively. The set $\{w_1, \ldots, W_k\}$ is denoted by W.

Each $w_i$ may be referred to as a window function. Intuitively, a window function $w_i$ may represent a part of the Boolean space over which f is defined. Every pair $(w_j, \bar{f}_i)$ may represent a partition of the function f. In, the example, the term "partition" is not being used in the sense where partitions have to be disjoint. If, in addition to conditions 1–3 (provided above), $w_i \wedge w_j = 0$ for $i \neq j$, then the partitions may be orthogonal. Each $(w_j, \bar{f}_i)$ may now be considered a partition in a conventional sense.

In constructing partitioned ROBDDs, the performance of partitioned ROBDDs generally depends on the ability to generate effective partitions of the Boolean space over which the function can be compactly represented. The issue of finding adequate partitions of the Boolean space is central to the partitioned-ROBDD representation. Described herein are example heuristics, which may be effective in generating compact, orthogonally partitioned-ROBDDs. Although a Boolean netlist is used in the present approach, the techniques described are general and may be applied or extended to any arbitrary sequence of Boolean operations.

In an example BDD partitioning approach, the number of windows may be decided either a priori or dynamically. After a window $w_i$ is decided, a partitioned-ROBDD corresponding to it may be obtained by composing F in the Boolean space corresponding to the window $w_i$. In partitioning, the BDD for some function F, a decomposed BDD representation (i.e., a BDD which is not in terms of input variables but in terms of some pseudo-input variables that are created in the process of building BDDs for the given target function F) is considered. To create the partitioned BDD for F, its corresponding decomposed BDD may be analyzed to yield the partitions. The partition decision may be typically taken because the decomposed BDD for F in terms of its decomposition points, $\Psi_1, \ldots, \Psi_k$ cannot be composed. Note, the partitioned BDD for F, from its decomposed BDD, may be created in following three ways:

(1) Partition using input variables. The number of input variables may be changed dynamically or can be set to a predetermined constant.

(2) Partition using "internal" variables, i.e., variables that are not input variables. Such variables can be pseudo-variables introduced at internal gates.

(3) Partition using a suitable combination of 1 and 2.

At any given point in time in the present filtering based verification process a decomposed representation may be reflected by, $f_d(\Psi, X)$, of F where $\Psi = \{\psi_1, \ldots, \psi_k\}$ is called a decomposition set and it corresponds to the internal cut set selected, typically, by the naive cut or the smart cut process, and each $\psi_i \in \Psi$. is a decomposition point. Let $\Psi_{bdd} = \{\psi_{1_{bdd}}, \ldots, \psi_{k_{bdd}}\}$ represent the array containing the ROBDDs of the decomposition points, i.e., each $\psi_i \in \Psi$. has a corresponding ROBDD, $\psi_{i_{bdd}} \in \Psi_{bdd}$, in terms of primary input variables as well as (possibly) other $.\psi_j \in \Psi.$, where $\psi_j \neq \psi_i$. Similarly, the array of $\psi_{i_{bdd}w_i}$ may be represented by $\Psi_{i_{bdd}w_i}$. The composition [?] of $.\psi_i$ in $f_d(\Psi, X)$ may be denoted by $f_d(\Psi, X) \cdot (\Psi_i \leftarrow \psi_{i_{bdd}})$, where, $$f_d(\Psi, X) \cdot (\psi_i \leftarrow \psi_{i_{bdd}}) = \overline{\psi_{i_{bdd}}} \cdot f_{d\overline{\psi_i}} + \psi_{i_{bdd}} \cdot f_{d_{\psi_i}}{}^n \quad (1)$$

The vector composition of the $\Psi$ in $f_d(\Psi, X)$ may be denoted by $f_d(\psi, X) \cdot (\psi \leftarrow \psi_{bdd})$ and may represent a successive composition of $\psi_i$'s into $f_d$.

In considering partitioning of a decomposed representation, given a window function $w_i$, a decomposed representation $f_d(\Psi, X)$, and the ROBDD array $\Psi_{bdd}$ of f, $f_i$ is sought such that the ROBDD representing $f_i = w_i \wedge f_i$ is smaller than f. It can be shown that all $w_i$, which may be nothing but cubes, may satisfy this requirement.

Given $f_d$, $\Psi_{bdd}$, and $w_i$s, the cofactors $\psi_{w_i}$ and $f_{d_{w_i}}$ may be created. By composing $\psi_{bdd_{w_i}}$ in $F_{d_{w_i}}$, the partition function $f_i=f_{w_i}f_i=f_{w_i}$ may be achieved. Thus, given a set of window functions $w_i$, the partitioned-ROBDD $x_f$ of f may be given by $\chi_f=\{(w_i, w_i \wedge f_{w_i})|1 \leq i \leq k\}$. It is generally easy to check that the above definition satisfies all the conditions of Definition 1.

If $w_i$ is a cube, $f_i$ has a smaller size than the ROBDD for f. Also, the ROBDD representing $w_i$ has k internal nodes where k is the number of literals in $w_i$. Because $w_i$ and $f_{w_i}$ have disjoint support, $|\overline{f}_i|=|w_i \wedge f_i|=(k+|f_i|) \approx |f_i|$. Also, because each intermediate result of building $f_i$ will be smaller than that of building f, the intermediate peak memory requirement is also reduced. This may not be true in the presence of dynamic variable reordering when f and $f_i$ can have different variable orderings. In practice, because dynamic variable reordering operates on smaller graphs in the case of partitioning, it is even more effective.

When the window function is a more complex function of PIs than a cube, $f_i=f_{w_i}$ may be used. $f_{w_i}$ is the generalized cofactor of f on $w_i$. The generalized cofactor of f on $w_i$ is generally much smaller than f. But in the example case provided, the size of the $i^{th}$ partitioned-ROBDD $|\overline{f}_i|$ can be $0(|w_i||f_i|)$ in the worst case. To avoid this, while using general window functions, $w_i$s may be used, which is generally small.

With regards to the selection of window functions, after deciding how to construct the partition function from a given window function, methods to obtain appropriate window functions may be evaluated. The methods may be divided into two categories: a priori selection and "explosion" based selection.

In a priori partitioning, a predetermined number of primary inputs (PIs) is selected to partition. If it is decided to partition on 'k' PIs, then $2^k$ partitions are created that correspond to all the binary assignments of these variables. For example, if it is decided to partition on $x_1$ and $x_2$, four partitions may be created: $x_1x_2, x_1\overline{x_2}, \overline{x_1}x_2$ and $\overline{x_1x_2}$. For a given window function of this type, partitioned-ROBDDs can be created, which are guaranteed to be smaller than the monolithic ROBDD. Because only one partition needs to be in the memory at a given time, success is highly likely in the selected space. The reduction in memory is large and may be accompanied by an overall reduction in the time taken to process all partitions as well.

Variables should be selected that maximize the partitioning achieved while minimizing the redundancy that may arise in creating different partitions independently. This reflects a fundamental principle of many divide and conquer approaches. The cost of partitioning a function f on variable x may be defined as:

$$\text{cost}_x(f) = \alpha[p_x(f)] + \beta[r_x(f)] \quad (2)$$

where $p_x(f)$ represents the partitioning factor and is given by, $$p_x(f) = \max\left(\frac{|f_x|}{|f|}, \frac{f_{\overline{x}}}{f}\right) \quad (3)$$

and $r_x(f)$ represents the redundancy factor and is given by, $$r_x(f) = \left(\frac{|f_x + f_{\overline{x}}|}{|f|}\right) \quad (4)$$

A lower partitioning factor may be beneficial as it implies that the worst of the two partitions is small and similarly a lower redundancy factor is beneficial because it implies that the total work involved in creating the two partitions is less. The variable x that has the lower overall cost is chosen for partitioning.

For a given vector of functions F and a variable x, the cost of partitioning may be defined as:

$$\text{cost}_x(F) = \sum_{i=1}^{k} \text{cost}_x(f_i)$$

The PIs may be numbered in increasing order of their cost of partitioning $f_d$ and $\Psi$ and the best 'k' (where 'k' is a predetermined number specified by the user) may also be selected. Using a similar cost function, PI variables may be selected as well as pseudo-variables, such as $a.\psi_{i_{bdd}}$ expressed in terms of PIs, to create partitioned-ROBDDs. In the example case, the cofactor operations may become generalized cofactor operations for window functions that are non-cubes. This type of selection, where all the PIs are ranked according to their cost of partitioning $f_d$ and $\Psi$, is called a static partition selection.

Alternatively, a dynamic partitioning strategy may be used in which the best PI (e.g. x) is selected based on $f_d$ and $\Psi$ and then the subsequent PIs are recursively selected based on $f_{d_x}$ and $\Psi_x$ in one partition and in $f_{d_{\overline{x}}}$ and $\Psi_{\overline{x}}$ in the other partition. The dynamic partitioning method may require an exponential number of cofactors and can be cost-prohibitive in certain circumstances. The cost can be somewhat reduced by exploiting the fact that the only values that are of interest are the sizes of the cofactors of $f_d$ and $\psi_{i_{bdd}}$s. An upper bound on the value of $|f_{d_x}|$ can be calculated by traversing the ROBDD of $f_d$ and taking the x=1 branch whenever the node with variable id corresponding to x is encountered. The method does not give the exact count as the BDD obtained by traversing the ROBDD in this manner is not reduced. One advantage of such an implementation is that no new nodes need to be created and the traversal is relatively quick.

Partitions may be created such that the number of partitions are chosen dynamically. In one case, each time the BDDs blow-up, partitioning is executed dynamically using splitting variables, chosen in the increment of 1, until the BDD blow-up is deemed to be circumvented.

In explosion based partitioning, the $\psi_{i_{bdd}}$s in $f_d$ is successively composed. If the graph size increases significantly for some composition (e.g. $\Psi_j$), a window function may be selected (e.g. w) based on the current $f_d$ and $\psi_{j_{bdd}}$. The window functions may be either a PI and its complement or some $\psi_{k_{bdd}}$ and its complement that is expressed in terms of PIs only and that has a small size.

Once the window function w is obtained, two partitions $(w \wedge f_{d_w}, \psi_w)$, and $(\overline{w} \wedge f_{d_w}, \psi_{\overline{w}})$ may be created and the routine on each of the partitions may be recursively recalled. In general, if the resulting BDD after composition is more than ten times larger then the sum of all the previous decomposed BDDs that have already been composed and the size of original decomposed BDD, explosion based partitioning may be executed.

In a priori variable selection, as well as explosion based partitioning, a fixed number of splitting variables is determined. Explosion based partitioning followed by a fixed number of primary input variables based partitioning (or a vice-versa process) may then be executed. The explosion based partitioning can use both the primary inputs as well as pseudo-variables/decomposition points.

After selecting a window function and creating the decomposed representation for the $i^{th}$ partition given by $f_{d_{w_i}}$ and $\psi_{w_i}$, the final step is to compose $\psi_{w_i}$ in $f_{d_{w_i}}$, i.e., $f_{d_{w_i}}(\psi, X)(\psi \leftarrow \psi_{bdd_{w_i}})$. Although, the final ROBDD size is constant for a given variable ordering, the intermediate memory requirement and the time for composition may be a strong function of the order in which the decomposition points are composed. For candidate variables that can be composed into $f_d$, a cost can be assigned that estimates the size of the resulting composed ROBDD. The variable with the lowest cost estimate may be composed. A decomposition variable may be chosen that leads to the smallest increase in the size of the support set of the ROBDD after composition. At each step, candidate $\psi_s$ may be restricted for composition to those decomposition points that are not present in any of the other $\psi_{bdd}$S. This may ensure that a decomposition variable needs to be composed only once in $f_d$.

Figure 2:
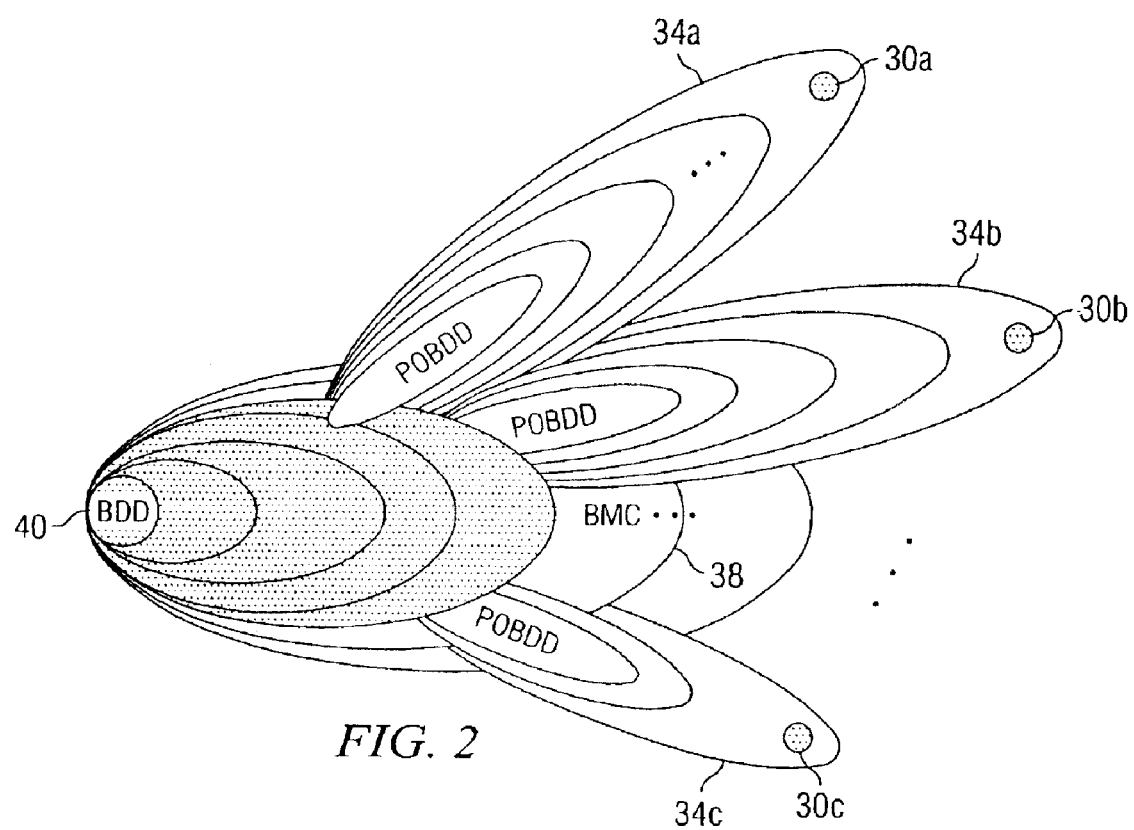
FIG. 2 is a simplified schematic diagram illustrating an example interaction between one or more elements that may be included within the system.

FIG. 2 is a simplified schematic diagram illustrating an example interaction between one or more elements that may be included within system 10. FIG. 2 illustrates a set of starting points 30a–c, a set of POBDD elements 34a–c, a BMC element 38, and a BDD element 40. These elements are abstractly represented and are intended to reflect general principles associated with system 10. POBDD techniques may be employed and an analysis, which may include imaging/preimaging operations, may be executed in order to determine a first set of states that are provenly deep and that are communicated to BMC tool element 20. POBDD techniques may refer to any operation that may be executed on a data structure in order to convert it into a canonical form. Partitioned refers to the fact that the Boolean space is being broken into different sub-spaces.

For purposes of teaching, it is helpful to explain some of the imaging and preimaging operations that are executed in conjunction with POBDD techniques. Functions generally map one domain to a co-domain. Variables may be represented in terms of X and outputs may be represented in terms of Y. Each combination of X may result in some representation of Y. For each combination of X, there may be a unique combination that results and this may define the function. An image is what is produced as a result of certain operations associated with the function. An operation may be applied on the domain and what results is an image. For example, a number of states may be present and from those states many other states may be reached. From ten states, a thousand states may be reached within target circuit 12. The thousand states may be considered as reflecting an image associated with the ten states.

The image operation may be considered as a prism or a mirror that provides some reflection in order to project the corresponding image. For a given image, an object and a mirror are employed to derive the image. The object may be referred to as the starting ten states, whereby the mirror is the operation and the thousand states is the image set. In a similar fashion, preimaging operations may be defined. The preimage in the example provided may be represented by the one thousand states. The operation is still represented by the mirror and an object may be derived using these two variables. Thus, in the case of images, an object and a mirror are present and the reflection is sought. In the case of preimaging, the reflection and the mirror are present and what is being sought is the original object that projected the image.

The image operation in the case of a states-based analysis may be referred to as a transition/relation operation. The transition/relation operation may link the transitions that are possible in a given state space, where there are certain rules that prohibit moving from state one to state ten because links are not present. The transitions that are possible and impossible may then be captured. Thus, the mirror (transition/relation operation) may indicate what transitions are possible in the system/circuit/state.

There are only some states that may be accessed after one application of a transition/relation operation. Accordingly, after applying the transition/relation operation, movement may be effectuated from that point to a greater depth. Similarly, from state one thousand, it may be determined the values of the original states using the transition/relation operation. Accordingly, a preimage may be achieved for a given set of states. The image is the reflection of the states as provided by the mirror (transition/relation operation). Imaging and/or preimaging techniques may be used in order to determine what is deep within target circuit 12.

In another example offered for purposes of teaching, it is assumed that line 1 and line 2 are states, whereby line 1 and line 2 are parallel and separated by a transition/relation element. In certain scenarios, the reflection of line 2 affects information associated with line 1. However, what is generally sought is everything reflected by either line 1 or line 2 exclusively. The image and preimage operations may be used in order to determine what is being received from each of the lines. By using the process of subtraction, it may be determined what is included in line 1 and line 2. What is left may be referred to as genuine objects, contenders, or choices that maintain their integrity. From this information, it can be determined what is causing confusion or errors and eliminate these elements from the process.

In another example, consider the case where set 1 includes states 1, 2 and 3. Further consider set two, which includes states 4 and 5. All of these elements may be reflected in states 10 and 11. In analyzing states 10 and 11, a reflection is provided that is coming from states 1, 2, 3, 4, and 5. It may be recognized that it is improper to consider 4 and 5 in an analysis associated with set 1 because these elements are associated with set 2. Thus, states 4 and 5 may be subtracted from the set whereby what is left is the genuine set from set 1 (states 1, 2, and 3). The distance between sets 1 and 2 can be identified as one unit. The difference between set 2 and set 0 is two units. A calculation may then be made, at a distance of one unit, between set 1 and set 0. In a next step, the analysis may shift to set −1 and the analysis may continue to set −2 and so forth. In this sense, the information is inductively being amassed such that the analysis continues to move back in order to generate greater distances and depth. This procedure allows verification of states deeper within target circuit 12.

In an example embodiment, 'deeper' generally refers to a depth parameter associated with target circuit 12, which is being analyzed. Certain states may be reachable and other states may be incapable of being reached without performing preliminary tasks first. States generally have different depths because some fixed point calculations may terminate early and some others may extend far into a given test circuit. This may be based on the characteristics of a given function. The given function may be configured such that under some window or sub-spaces, the analysis may continue for an extended depth. Additionally, provenly deep states and a heuristical set of states may be present. The provenly deep states generally require a significant amount of work in order to determine if they are deep. A heuristical set of states generally provides no guarantee as to depth. Heuristical states may be provided (potentially quickly), however, it is unknown whether these states are deep. Thus, a balance is generally achieved between these two principles. Neither speed nor depth may be neglected in executing properly verification techniques. By using POBDD data structure 14, some states may be calculated that are potentially deep or certain states may be projected as 'usually' deep and those states may be targeted for sampling.

Referring back to FIG. 2, BMC element 38 allows a small sampling or segment of a sub-space to be explored in association with a fixed point. Once the fixed point is reached, a fixed point calculation may be executed on another sub-space. The random sampling may be executed on multiple sub-spaces, whereby the first set of states is effectively handed off by POBDD elements 34a–c to BMC element 38. After identifying the first set of states, it may be determined which sub-spaces have the greatest depth. For the sub-spaces that have the greatest depth, a particular set of states may be assumed to be the deepest set of states that are easily calculated. These states may be provided to BMC element 38 to take as an initial set of states in executing a deeper verification of a given circuit under test. BDD element 40 serves as the foundation or core protocol on which POBDD and BMC operations are predicated.

POBDD based BMC allows for the possibility of "Navigated Traversal" in choosing a direction to explore deeply. System 10 may further allow for a controlled form of mixing Breadth First Search (BFS) with Depth First Search (DFS) because it may allow for reaching deep states (potentially selectively).

Appropriate time intervals may also be provided in conjunction with the sampling of multiple sub-spaces within a given circuit under test. A certain amount of time may be configured in order to evaluate various sub-spaces spaces within a target. Once the time interval has expired, the process may stop and a determination may be made. The time interval may be based on expediency issues or practicality parameters associated with a given verification process. Where no deep states are found during the designated time interval, the program may be run in a difficult mode that includes a larger time out value. Alternatively, the manner in which the selection was executed may change such that any of the already sampled sub-spaces (or types of spaces) are not revisited. By giving a guarantee or a fixed proof that a deep state will be encountered, a significant gain in efficiency may be achieved with a minimal loss. This gain in efficiency may be disproportionately high as compared to the loss.

Figure 3:
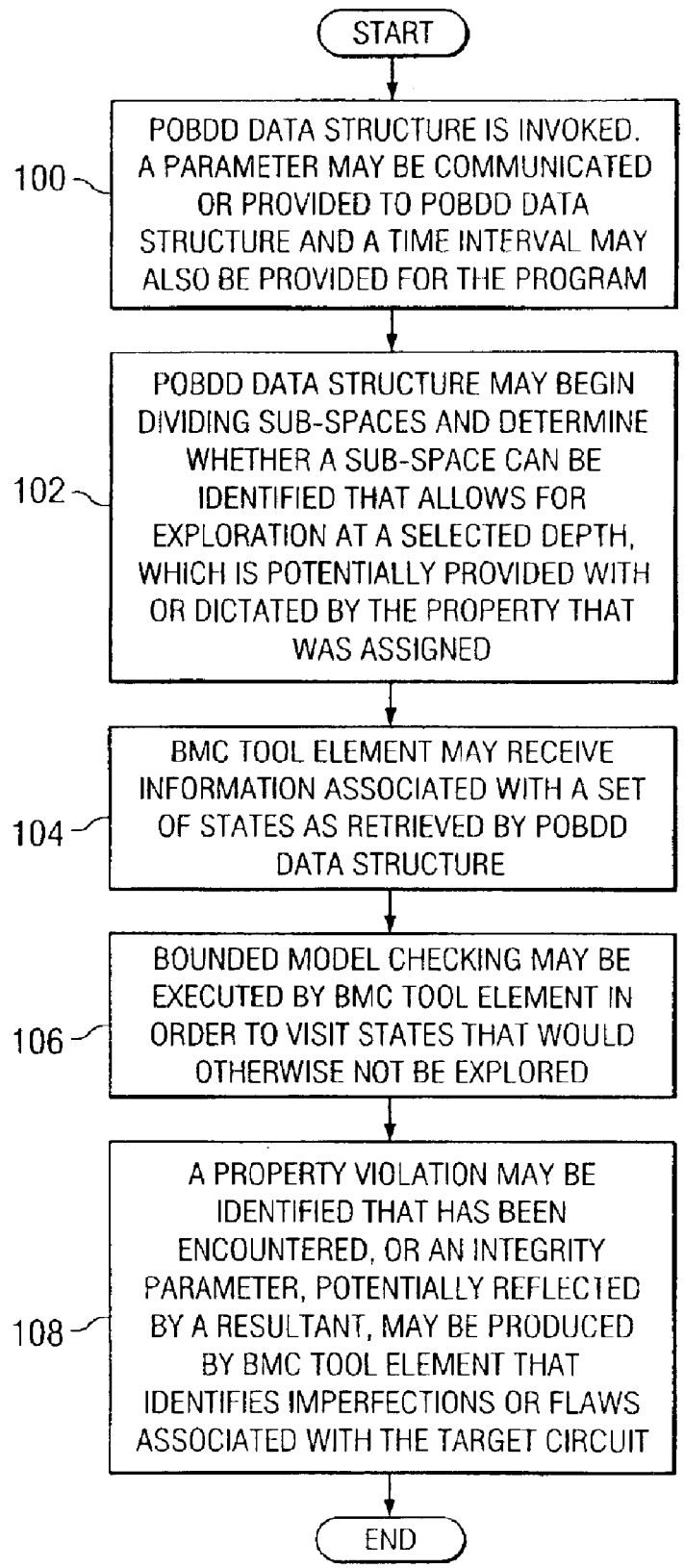
FIG. 3 is a flowchart illustrating a series of example steps associated with a method for verifying a plurality of states associated with a target circuit in accordance with one embodiment of the present invention.

FIG. 3 is a simplified flow chart illustrating a series of example steps associated with a method for verifying one or more properties associated with target circuit 12. The method may begin when a designer evaluates a particular circuit, such as target circuit 12, and focuses on some property that needs to be verified. The designer may or may not know that, with respect to the particular property, the selected sub-space of target circuit 12 is deep. In order to allow BMC tool element 20 to extend to a great depth into target circuit 12, POBDD data structure 14 may be invoked at step 100. A parameter may be communicated or provided to POBDD data structure 14 and a time out interval may also be provided for the program. For example, it may be designated that the program being executed by POBDD data structure should not exceed five-thousand seconds.

At step 102, POBDD data structure 14 may begin dividing sub-spaces and determine whether a sub-space can be identified that allows for exploration at a selected depth, which is potentially provided with or dictated by the property that was assigned. If this process is executed within the time interval, the process may be deemed to be satisfied. In cases where the program is not executed within the time interval, the maximum depth achieved may be displayed. Alternatively, the time out interval may be modified and the program performed again. In other cases, the sub-space sampling location may be appropriately changed such that an optimal depth is reached.

At step 104, BMC tool element 20 may receive information associated with a set of states as retrieved by POBDD data structure 14. At step 106, BMC tool element 20 may venture deeper into target circuit 12 because it is being provided with an enhanced starting point. Bounded model checking may be executed by BMC tool element 20 in order to visit states that would otherwise not be explored. The enhanced set of starting states, as reflected in a first data set, augments the efficacy of the verification process being executed by BMC tool element 20. At step 108, it may be identified that a property violation has been encountered, or an integrity parameter, potentially reflected by a resultant, may be produced by BMC tool element 20 that identifies imperfections or flaws associated with target circuit 12. This information may then be used in order to correct or amend problems or specifications associated with the manufacturing or design process. Alternatively, the information or resultant may be used to fix a corresponding product such that it meets the criteria provided by the designer.

The random sampling provides a reasonable evaluation associated with target circuit 12. The sampling is not necessarily a guarantee, as other sub-spaces could have been sampled and other errors could have been encountered. Based on practically concerns, a product designer or a digital system operator may determine the scope and accuracy parameters associated with a given verification procedure.

Some of the steps illustrated in FIG. 3 may be changed or deleted where appropriate and additional steps may also be added to the flowchart. These changes may be based on specific verification architectures or particular bounded model checking arrangements and configurations and do not depart from the scope or the teachings of the present invention.

Although the present invention has been described in detail with reference to particular embodiments, system 10 may be extended to any scenario in which verification is sought for a given target that has been designed or manufactured to perform a selected task or to include a designated property. Moreover, significant flexibility is provided by system 10 in that any suitable one or more components may be replaced with other components that facilitate their operations. For example, although system 10 has been described with reference to particular components such as BMC tool element 20, POBDD data structure 14, and algorithm element 16, these elements may be provided in a single integral unit where appropriate or replaced with devices that effectuate their functions. POBDD data structure 14 may be used with any other suitable checking or simulation protocol in order to enhance the verification capabilities thereof. Additionally, designer information 24 may be communicated or otherwise offered to POBDD data structure 14 in any appropriate manner such that BMC tool element 20 is provided with enhanced starting points for executing bounded model checking.

In addition, although system 10 has been described with reference to one or more discreet components, additional intermediate components may be provided to system 10 in order to facilitate the processing operations thereof. For example, additional components may be used in the communication of information between BMC tool element 20 and POBDD data structure 14. The present invention enjoys considerable versatility in that these components may be capable of operating in conjunction with various intermediate processing elements, in any suitable fashion, that facilitate the verification procedure for a given target element or object.

Numerous other changes, substitutions, variations, alterations, and modifications may be ascertained by those skilled in the art and it is intended that the present invention encompass all such changes, substitutions, variations, alterations, and modifications as falling within the spirit and scope of the appended claims. Moreover, the present invention is not intended to be limited in any way by any statement in the specification that is not otherwise reflected in the appended claims.

What is claimed is:

1. An apparatus for verifying a property associated with a target circuit, comprising:
    a partitioned ordered binary decision diagram (POBDD) data structure operable to receive information associated with a target circuit, the information identifying a property within the target circuit to be verified, the POBDD data structure executing one or more operations in order to generate a first set of states at a first depth associated with a sub-space within the target circuit; and
    a bounded model checking (BMC) tool element operable to receive the first set of states from the POBDD data structure, the BMC tool element executing one or more bounded model checking operations using the first set of states in order to generate a second set of states at a second depth associated with the sub-space within the target circuit, the first set of states being used as a basis for the second set of states such that the second depth is greater than the first depth.

2. The apparatus of claim 1, further comprising:
    an algorithm element coupled to the POBDD data structure, wherein the algorithm element includes one or more algorithms that are executed in order to verify the property included within the target circuit.

3. The apparatus of claim 1, wherein the first set of states is translated into a binary decision diagram (BDD) language protocol and mapped to a conjunctive normal form (CNF) formula, the CNF formula being communicated to the BMC tool element as the first set of states from which the BMC tool element generates the second set of states.

4. The apparatus of claim 1, wherein one or more imaging operations are executed on the information in order to generate the second set of states at the second depth.

5. The apparatus of claim 1, wherein one or more preimaging operations are executed on the information in order to generate the first set of states at the first depth.

6. The apparatus of claim 1, wherein the BMC tool element executes one or more satisfiability (SAT) procedures in order to generate the second set of states at the second depth.

7. The apparatus of claim 1, wherein the information includes a time interval in which the POBDD data structure executes verification in order to generate the first set of states at the first depth.

8. The apparatus of claim 1, wherein the BMC tool element produces a resultant that reflects an integrity parameter associated with the property being verified, the integrity parameter identifying whether one or more errors are present in the target circuit.

9. A method for verifying a property associated with a target circuit, comprising:
    receiving information associated with a target circuit, the information identifying a property within the target circuit to be verified;
    executing one or more partitioned ordered binary decision diagram (POBDD) operations using the information in order to generate a first set of states at a first depth associated with a sub-space within the target circuit; and
    executing a bounded model checking operation using the first set of states in order to generate a second set of states at a second depth associated with the sub-space within the target circuit, the first set of states being used as a basis for the second set of states such that the second depth is greater than the first depth.

10. The method of claim 9, further comprising:
    executing one or more algorithms in order to verify the property associated with the target circuit.

11. The method of claim 9, further comprising:
    translating the first set of states into a binary decision diagram (BDD) language protocol; and
    correlating the BDD language protocol to a conjunctive normal form (CNF) formula, the CNF formula reflecting the first set of states from which the second set of states is generated.

12. The method of claim 9, further comprising:
    executing one or more imaging operations on the information in order to generate the second set of states at the second depth.

13. The method of claim 9, further comprising:
    executing one or more preimaging operations on the information in order to generate the first set of states at the first depth.

14. The method of claim 9, further comprising:
    executing one or more satisfiability (SAT) procedures in order to generate the second set of states at the second depth.

15. The method of claim 9, wherein the information includes a time interval in which to generate the first set of states at the first depth.

16. The method of claim 9, further comprising:
    generating a resultant that reflects an integrity parameter associated with the property being verified, the integrity parameter identifying whether one or more errors are present in the target circuit.

17. A system for verifying a property associated with a target circuit, comprising:
    means for receiving information associated with a target circuit, the information identifying a property within the target circuit to be verified;
    means for executing one or more partitioned ordered binary decision diagram (POBDD) operations using the information in order to generate a first set of states at a first depth associated with a sub-space within the target circuit; and
    means for executing a bounded model checking operation using the first set of states in order to generate a second set of states at a second depth associated with the sub-space within the target circuit, the first set of states being used as a basis for the second set of states such that the second depth is greater than the first depth.

18. The system of claim 17, further comprising:
    means for executing one or more algorithms in order to verify the property associated with the target circuit.

19. The system of claim 17, further comprising:
    means for translating the first set of states into a binary decision diagram (BDD) language protocol; and
    means for correlating the BDD language protocol to a conjunctive normal form (CNF) formula, the CNF formula reflecting the first set of states from which the second set of states is generated.

20. The system of claim 17, further comprising:
means for executing one or more imaging operations on the information in order to generate the second set of states at the second depth.

21. The system of claim 17, further comprising:
means for executing one or more preimaging operations on the information in order to generate the first set of states at the first depth.

22. The system of claim 17, further comprising:
means for executing one or more satisfiability (SAT) procedures in order to generate the second set of states at the second depth.

23. The system of claim 17, further comprising:
means for generating a resultant that reflects an integrity parameter associated with the property being verified, the integrity parameter identifying whether one or more errors are present in the target circuit.

24. A computer readable medium for verifying a property associated with a target circuit, the computer readable medium comprising code operable to:
receive information associated with a target circuit, the information identifying a property within the target circuit to be verified;
execute one or more partitioned ordered binary decision diagram (POBDD) operations using the information in order to generate a first set of states at a first depth associated with a sub-space within the target circuit; and
execute a bounded model checking operation using the first set of states in order to generate a second set of states at a second depth associated with the sub-space within the target circuit, the first set of states being used as a basis for the second set of states such that the second depth is greater than the first depth.

25. The medium of claim 24, wherein the code is further operable to:
execute one or more algorithms in order to verify the property associated with the target circuit.

26. The, medium of claim 24, wherein the code is further operable to:
translate the first set of states into a binary decision diagram (BDD) language protocol; and
correlate the BDD language protocol to a conjunctive normal form (CNF) formula, the CNF formula reflecting the first set of states from which the second set of states is generated.

27. The medium of claim 24, wherein the code is further operable to:
execute one or more imaging operations on the information in order to generate the second set of states at the second depth.

28. The medium of claim 24, wherein the code is further operable to:
execute one or more preimaging operations on the information in order to generate the first set of states at the first depth.

29. The medium of claim 24, wherein the code is further operable to:
execute one or more satisfiability (SAT) procedures in order to generate the second set of states at the second depth.

30. The medium of claim 24, wherein the code is further operable to:
generate a resultant that reflects an integrity parameter associated with the property being verified, the integrity parameter identifying whether one or more errors are present in the target circuit.

* * * * *

UNITED STATES PATENT AND TRADEMARK OFFICE
CERTIFICATE OF CORRECTION

| | |
|---|---|
| PATENT NO. | : 6,904,578 B2 |
| APPLICATION NO. | : 10/391282 |
| DATED | : June 7, 2005 |
| INVENTOR(S) | : Jain et al. |

Page 1 of 1

It is certified that error appears in the above-identified patent and that said Letters Patent is hereby corrected as shown below:

Column 13, Line 29, after "sub-spaces" delete "spaces".

Signed and Sealed this

Twenty-sixth Day of December, 2006

JON W. DUDAS
*Director of the United States Patent and Trademark Office*